United States Patent
Afzali-Ardakani et al.

(10) Patent No.: US 10,658,030 B2
(45) Date of Patent: May 19, 2020

(54) SYNAPTIC CROSSBAR MEMORY ARRAY

(71) Applicant: International Business Machines Corporation, Armonk, NY (US)

(72) Inventors: Ali Afzali-Ardakani, Ossining, NY (US); Talia S. Gershon, White Plains, NY (US); Pouya Hashemi, White Plains, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/826,654

(22) Filed: Nov. 29, 2017

(65) Prior Publication Data

US 2019/0164597 A1    May 30, 2019

(51) Int. Cl.
| | |
|---|---|
| *H01L 45/00* | (2006.01) |
| *G11C 11/54* | (2006.01) |
| *H01L 23/528* | (2006.01) |
| *G11C 13/00* | (2006.01) |
| *H01L 23/532* | (2006.01) |

(Continued)

(52) U.S. Cl.
CPC ......... *G11C 11/54* (2013.01); *G11C 13/0004* (2013.01); *G11C 17/165* (2013.01); *H01L 23/528* (2013.01); *H01L 23/5226* (2013.01); *H01L 23/53228* (2013.01); *H01L 23/53257* (2013.01); *H01L 27/2436* (2013.01); *H01L 27/2463* (2013.01); *H01L 45/06* (2013.01); *H01L 45/126* (2013.01); *H01L 45/1233* (2013.01); *H01L 45/148* (2013.01); *H01L 45/1608* (2013.01); *H01L 45/1666* (2013.01); *G11C 13/0069* (2013.01); *G11C 2213/52* (2013.01); *G11C 2213/72* (2013.01)

(58) Field of Classification Search
CPC .................................................... G11C 11/54
USPC ........................................................ 365/148
See application file for complete search history.

(56) References Cited

U.S. PATENT DOCUMENTS

| | | | |
|---|---|---|---|
| 7,408,212 B1 * | 8/2008 | Luan ................. | G11C 13/0007 257/295 |
| 8,492,195 B2 * | 7/2013 | Herner .................. | H01L 45/16 257/401 |

(Continued)

OTHER PUBLICATIONS

Yuchao Yang, et al., Oxide Heterostructure Resisitive Memory, Nano Lett., 2013, 13, 2908-2915.

(Continued)

*Primary Examiner* — Min Huang
(74) *Attorney, Agent, or Firm* — Law Office of Charles W. Peterson, Jr.; Louis J. Percello, Esq.; Erik K. Johnson, Esq.

(57) ABSTRACT

A method of forming an Integrated Circuit (IC) chip, the IC chip and an on-chip synaptic crossbar memory array. Chip devices are formed on a surface of a semiconductor wafer. A connective layer is formed above the chip devices. A bottom electrode layer is formed on the connective layer. A neuromorphic synapse layer is formed above the bottom electrode layer with each synapse on a bottom electrode. Upper electrodes are formed above the synapses and orthogonal to bottom electrode lines. Each synapse being beneath an upper electrode where the upper electrode crosses a bottom electrode. Upper electrodes are refractory metal and the bottom electrodes are copper, or vice versa.

20 Claims, 7 Drawing Sheets

(51) Int. Cl.
*H01L 23/522* (2006.01)
*H01L 27/24* (2006.01)
*G11C 17/16* (2006.01)

(56) References Cited

U.S. PATENT DOCUMENTS

| | | | | | |
|---|---|---|---|---|---|
| 8,559,209 | B2* | 10/2013 | Siau | ................ | G11C 8/08 365/148 |
| 8,658,476 | B1* | 2/2014 | Sun | ................ | H01L 45/148 257/2 |
| 8,791,010 | B1* | 7/2014 | Herner | ................ | H01L 45/1233 438/618 |
| 2010/0295012 | A1* | 11/2010 | Mikawa | ................ | G11C 13/0007 257/4 |
| 2012/0075907 | A1* | 3/2012 | Jo | ................ | G11C 11/22 365/148 |
| 2012/0084241 | A1* | 4/2012 | Friedman | ................ | G06N 3/049 706/27 |
| 2012/0109866 | A1* | 5/2012 | Modha | ................ | G06N 3/063 706/28 |
| 2013/0294136 | A1* | 11/2013 | Siau | ................ | G11C 7/04 365/66 |
| 2014/0177315 | A1* | 6/2014 | Pramanik | ................ | G11C 13/0069 365/148 |
| 2014/0183622 | A1* | 7/2014 | Lin | ................ | H01L 29/47 257/329 |
| 2016/0005461 | A1* | 1/2016 | Jo | ................ | G11C 29/026 365/148 |
| 2016/0336064 | A1* | 11/2016 | Seo | ................ | G06N 3/088 |
| 2018/0114560 | A1* | 4/2018 | Kim | ................ | H01L 29/78391 |

OTHER PUBLICATIONS

Bersuker et al., Metal Oxide Resistive Memory, J. Apply. Phys. 2011, 110, 124518.

D. C. Kim, et al., Electrical observations of filamentary conductions for the resistive memory switching in NiO films; Apply. Phys. Lett.; 2006, 88, 202102.

* cited by examiner

SYNAPTIC CROSSBAR MEMORY ARRAY

BACKGROUND

Field of the Invention

The present invention is related to Integrated Circuit (IC) chip manufacturing and particularly to manufacturing IC chips with an on-chip crossbar synapse array.

Background Description

Neuromorphic computing, which uses electronic synapses to mimic neuro-biological architectures present in the nervous system, recently has attracted a lot of interest. These electronic synapses have provided error tolerant, massive parallelism easing inputting complex information. Making massive parallelism for these electronic synapses feasible requires a very high degree of integration coupled with very low drive power.

Typical state of the art neuromorphic synapses are metal oxide-based resistive switching devices. Unfortunately, the resistance of these resistive switching devices has been highly variable. The degree of variation degrades cell accuracy, degrading neuromorphic devices and system reliability.

Thus, there is a need for reliable neuromorphic synapses and more particularly for reliable electronic synapses with precise programming resistances.

SUMMARY

A feature of the invention is a synaptic crossbar memory array alterable with Joule heating pulses;

Another feature of the invention is a synaptic crossbar memory array with a wide range of precisely programmed resistance values that may represent synaptic weights.

In one aspect, the present invention relates to a method of forming an Integrated Circuit (IC) chip, the IC chip and a neuromorphic synapse on the IC chip. Chip devices are formed on a surface of a semiconductor wafer. A connective layer is formed above the chip devices. A bottom electrode layer is formed on the connective layer. A neuromorphic synapse layer is formed above the bottom electrode layer with each synapse on a bottom electrode. Upper electrodes are formed above the synapses and orthogonal to bottom electrode lines. Each synapse being beneath an upper electrode where the upper electrode crosses a bottom electrode. Upper electrodes are refractory metal and the bottom electrodes are copper, or vice versa.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION

Figure 1:
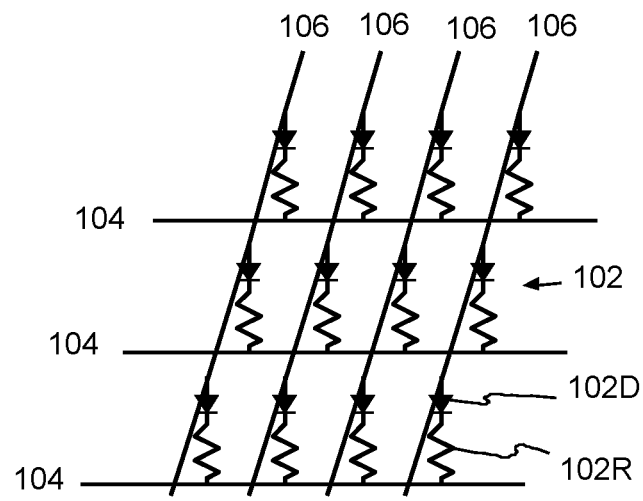
FIG. 1 shows an example of a schematic circuit diagram of a preferred synaptic crossbar memory array according to preferred embodiments of the present invention.

Turning now to the drawings and more particularly FIG. 1 shows a schematic example of a preferred synaptic crossbar or crosspoint memory array 100 of preferred electronic synapses 102, according to preferred embodiments of the present invention. The array 100 includes multiple lower electrode lines 104 in one direction, e.g., they direction, and multiple upper electrode lines 106 in an orthogonal direction, e.g., the x direction, and an electronic synapse 102 at each intersection of the electrode lines 104, 106.

Each synapse 102 includes a resistor 102R with one-time-alterable resistance in series with a diode 102D, and between a lower electrode line 104 and an upper electrode line 106. Each alterable resistor 102R of this example may be defined for at least two resistive states. The resistor 102R states include a first, un-altered or initial resistance state and a second, altered resistance state. Joule heating to alters the resistance, switching the resistor 102R from the un-altered state to the altered state. In the present example, the initial state is the highest resistance state, and the altered state is a somewhat lower, selected resistance state.

A conventional one-time-programmable (OTP) memory cell, such as a programmable fuse or anti-fuse, has two and only two discrete, programmable, resistive states for a one ("1") and a zero ("0"). In contrast for a preferred synapse 102 the alterable resistor 102R has an altered state that may be programmed to a resistance within a wide range of resistances. Optionally, the alterable resistor 102R may have a wide, continuous (analog) programmable resistance value range, or several discrete (digital) selectable states. Once programmed to a selected resistance, the alterable resistor 102R remains in that altered state at that selected resistance.

Figure 2:
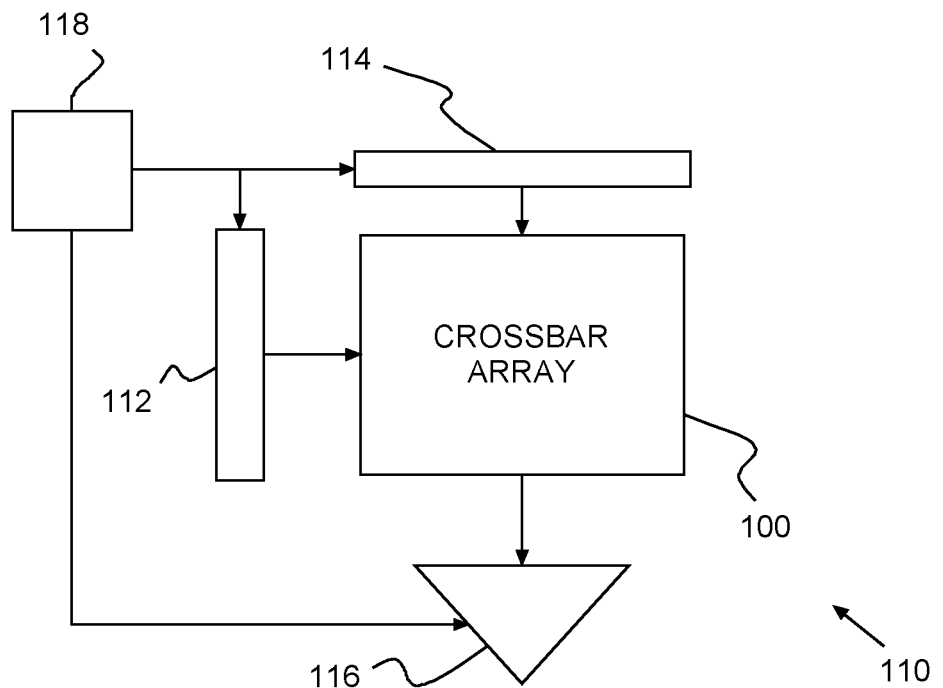
FIG. 2 shows a schematic example of a chip or macro including a preferred synaptic crossbar memory array.

FIG. 2 shows a schematic example of a chip or macro 110 including a preferred synaptic crossbar memory array 100 of FIG. 1. Decoders 112, 114 select and drive the electrode lines 104, 106. Sense amplifiers 116 sense the contents of a selected (by row and column) synapse 102. Glue circuits 118, e.g., timing, buffer or re-drive circuits, and external receivers and drivers interfacing the array 100 off chip or macro 110. It is understood that although shown in this example as part of the chip or macro 110, the support circuits 112, 114, 116 and/or 118 may be provided on a separate chip without departing from the present invention.

Figure 3:
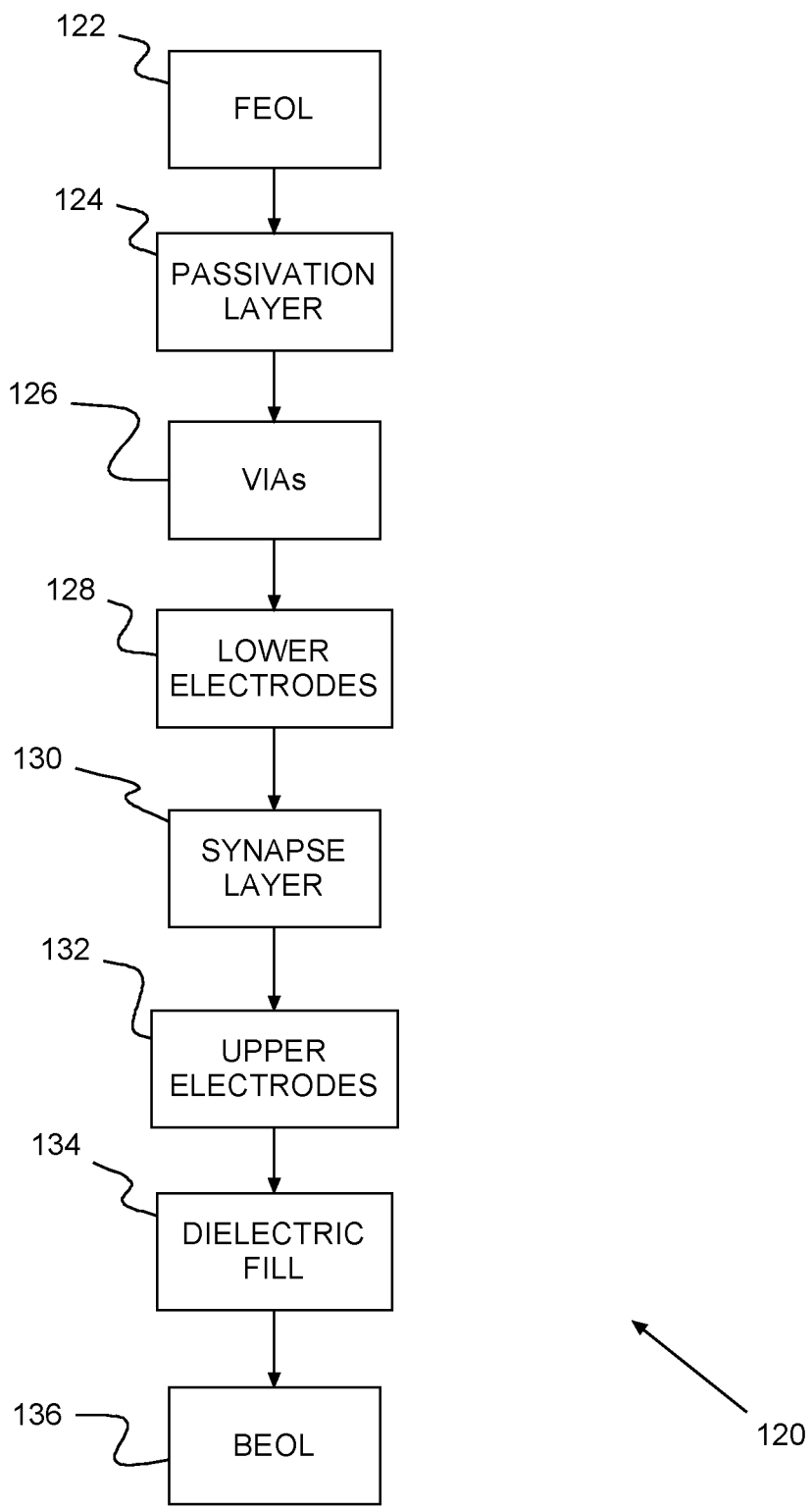
FIG. 3 shows an example of a method of forming a preferred synaptic crossbar memory array on a chip or macro.

FIG. 3 shows an example of a method 120 of forming a preferred synaptic crossbar memory array 100 on a chip or macro 110, e.g., of FIGS. 1 and 2. Formation begins after what is known as the Front End Of the Line (FEOL), where circuit devices are defined and formed 122 on a semiconductor wafer. A passivation or dielectric layer formed 124 on the FEOL wafer passivates the previously formed circuit devices. Interlevel vias formed 126 through the passivation layer provide for connection to the underlying circuit devices. A lower electrode layer is formed on the FEOL wafer and patterned 128 to define lower electrode lines 104. The patterned lower electrode lines 104 connect through the interlevel vias to the FEOL circuit devices. A dielectric layer is formed on the wafer and planarized to the lower electrode lines 104, e.g., with a typical chemical mechanical polish (CMP).

Synapse formation begins with a semiconductor synapse layer formed on the patterned lower electrode layer. The semiconductor synapse layer is patterned 130 to define synapses 102 on the lower electrode lines 104. Dielectric deposited on the wafer and planarized fills between the synapses 102. Upper electrode lines 106 are formed 132 above the synapses 102, completing the synapse array 100. An interlayer dielectric 134 is deposited on the array 100, filling between upper electrode lines 106. Planarizing, e.g., using CMP, re-exposes the upper electrode lines 106. Chip fabrication continues through the Back End Of the Line (BEOL) 136 to complete the chip or macro 110.

Preferably, either the lower electrode lines 104 are copper and the upper electrode lines 106 are refractory metal, or vice versa. The preferred semiconductor is amorphous, e.g., amorphous germanium (a-Ge). Preferably, the refractory metal is tungsten (W), titanium (Ti), titanium nitride (TiN) or a combinations thereof. The refractory metal forms a Schottky barrier diode at one end that acts as a selector device 102D for the amorphous semiconductor synapse 102; while the copper forms an ohmic contact at the other. Joule heating pulses selectively diffuse copper into the amorphous semiconductor synapse, altering the synapse resistance 102R.

Figure 4A:
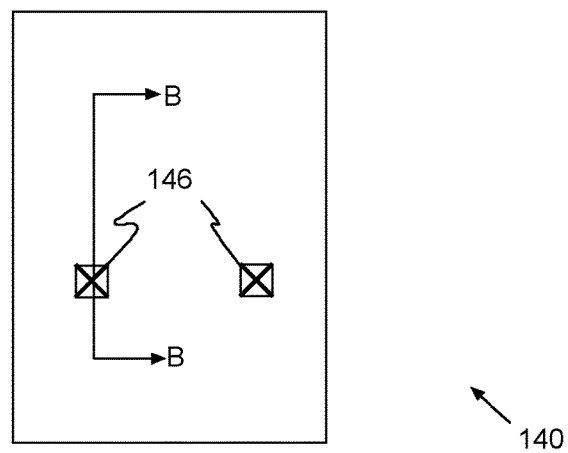
FIG. 4A-B shows an example of a chip after forming interlevel vias for a preferred synaptic crossbar memory array.
Figure 4B:
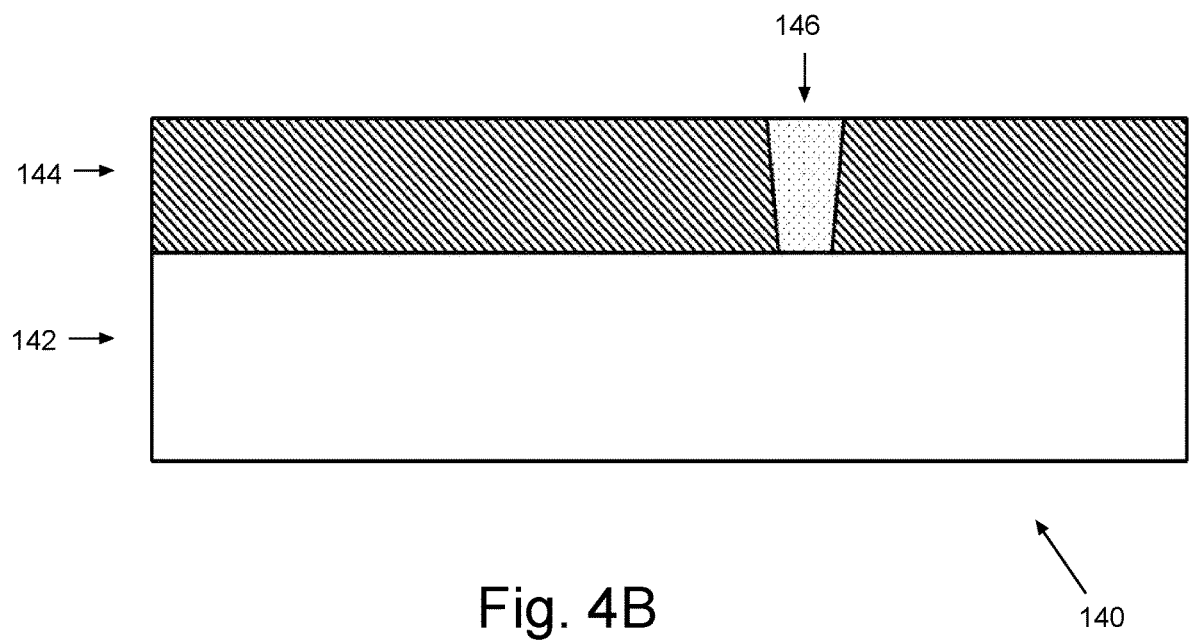

The example of FIGS. 4A-B shows a plan and cross-sectional view through B-B of an area of a chip 140 after forming interlevel vias for a preferred synaptic crossbar memory array, e.g., 100 of FIG. 1. It is understood that the example of FIGS. 4A-B shows a representative array area, e.g., near an edge or corner of a crossbar array on a chip 140.

Array formation begins after FEOL 122 steps on a wafer 142 and at least through forming typical circuit devices (not shown), e.g., Field Effect Transistors (FETs). Optionally, the FEOL wafer 142 may include one or more typical wiring layers (also not shown) formed above the device layers. A dielectric layer 144, preferably low temperature (low-T) nitride, is deposited 124 on the FEOL wafer 142. The dielectric layer 144 passivates and insulates previously formed circuit devices. Interlevel vias 146 formed 126 through the passivation layer provide for connection to the underlying circuit devices.

Figure 5A:
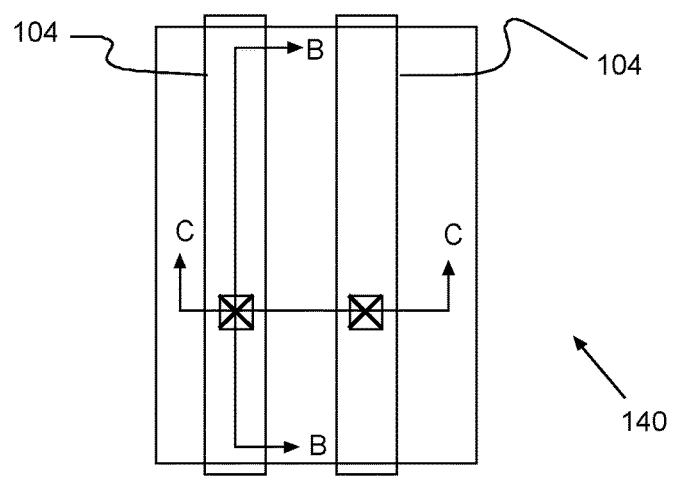
FIGS. 5A-C show an example of forming lower electrode lines and synapses on the chip.
Figure 5B:
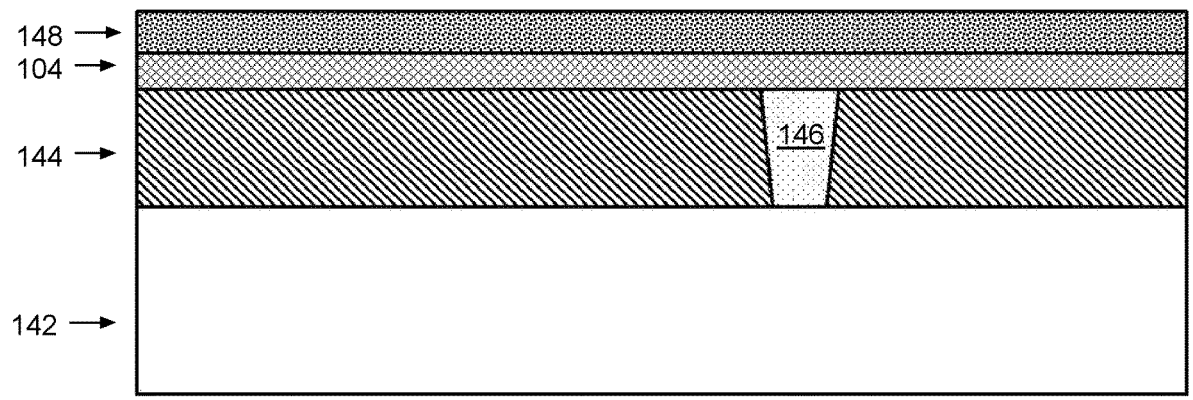
Figure 5C:
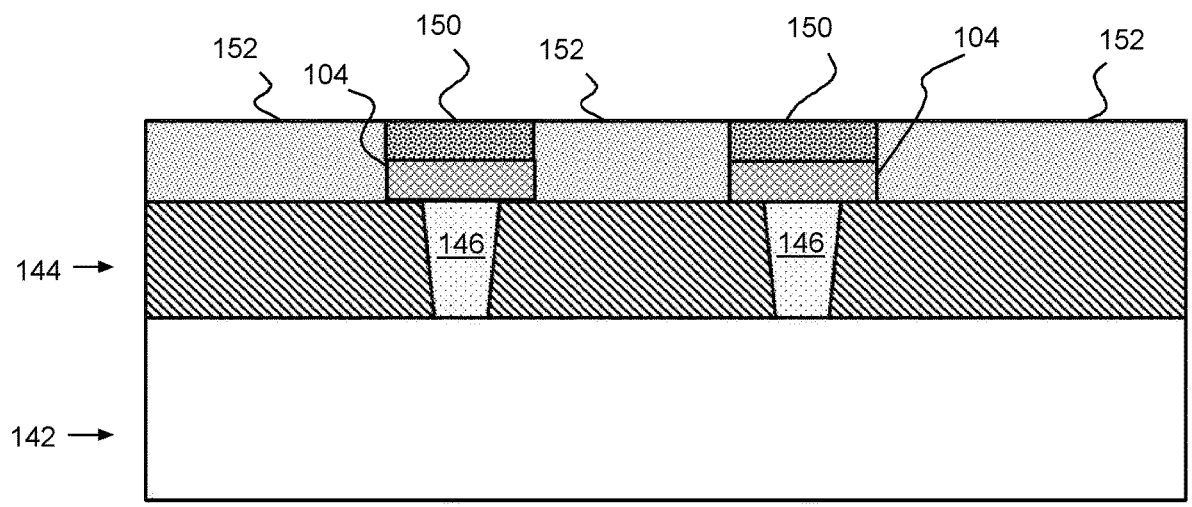

The example of FIG. 5A-C shows a plan and cross-sectional views through B-B and C-C of forming lower electrode lines 104 and synapses 102 on the chip 140 of FIGS. 4A-B with like features labeled identically. A conductive layer, e.g., refractory metal or copper, is formed on the dielectric layer 144 and patterned 124 to define lower electrode lines 104. For a copper lower electrode layer 104 patterning 128 may be with, for example, a typical dual damascene definition step. A dual damascene step forms the lower electrode lines 104 separated by insulating material. Typically, each lower electrode line 104 contacts underlying circuit devices (transistors) through one or more interlevel vias 146.

Alternately, the lower electrode layer may be a layer of refractory metal patterned 128 in a typical mask and etch step to define the refractory lower electrode lines 104. Then, insulating material layer is deposited and the wafer is planarized, e.g., using a typical chemical mechanical polish (CMP), to the lower electrode lines 104. Again, each lower electrode line 104 may contact underlying circuit devices (transistors) through one or more interlevel vias 146.

A synapse layer, preferably, 10 to 100 nanometers (10-100 nm) thick, is formed on the wafer and above the lower electrode lines 104. The preferred semiconductor synapse material is amorphous germanium, doped or un-doped, hydrogenated or un-hydrogenated, and containing one or more of O, N, C, F, Cl, Ar, deuterium (D). Preferably, an amorphous germanium synapse layer is deposited, e.g., using a typical sputter or thermal or electron-beam evaporation deposition step. In another example, amorphous germanium is hydrogenated and grown with plasma-enhanced Chemical Vapor Deposition (CVD) using a gas mixture containing GeH4; or sputtering in ambient a-Ge from containing target Ge and $H_2$.

Un-doped amorphous germanium, which exhibits high resistance in its original or un-altered state, may be used. Alternately, the semiconductor layer may be doped with a suitable dopant to adjust resistivity down to a selected value. Suitable dopants for amorphous Ge include, for example, Cu, Au, Bi, B, In, Al, Ga, As, P. As known in the art, the resistivity of amorphous Ge depends on its growth conditions as well as the type and concentration of dopants present in the film. For example, phosphorus-doped hydrogenated amorphous germanium grown by plasma-enhanced CVD from a mixture of $GeH_4$, $H_2$ and $PH_3$, has a resistivity ($\rho$) of ten ohm-centimeters ($\rho$=10 a-cm). In a twenty nanometer square (A=20 nm×20 nm) and 25 nm thick (L=25 nm) synapse 102, the alterable resistor 102R has an un-switched resistance (R=$\rho$L/A) on the order of six mega ohms (~6 M$\Omega$). Although described herein with reference to amorphous germanium, it is understood that the semiconductor, may be a nano-crystalline or micro-crystalline semiconductor without departing from the spirit or scope of the present invention.

Patterning the synapse layer defines synapses 102 on the lower electrodes 104. Optionally, a hard mask layer (not shown), e.g. dielectric, may be deposited on the amorphous germanium layer 148. The hard mask layer is patterned for etching the germanium layer 148 to define amorphous germanium ridges 150. After etching the germanium layer 148, the dielectric hard mask may be removed. When the ridges 150 are complete, additional insulating material 152 is deposited and the wafer is planarized, e.g., with a CMP, to the germanium layer 148.

Figure 6A:
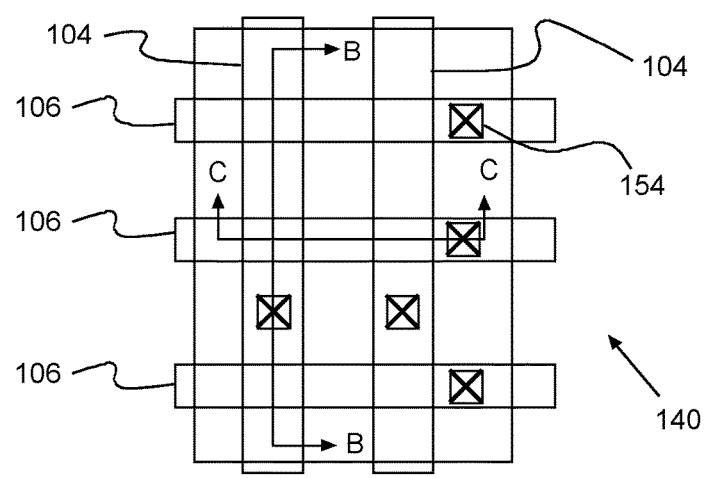
FIGS. 6A-C show an example of completed upper electrode lines on the array.
Figure 6B:
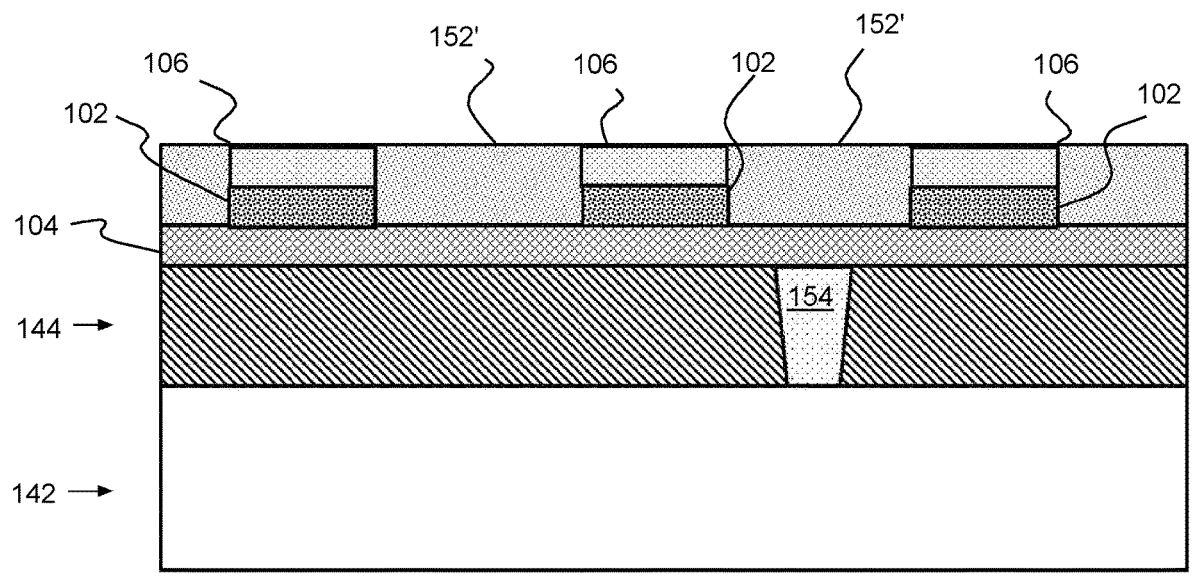
Figure 6C:
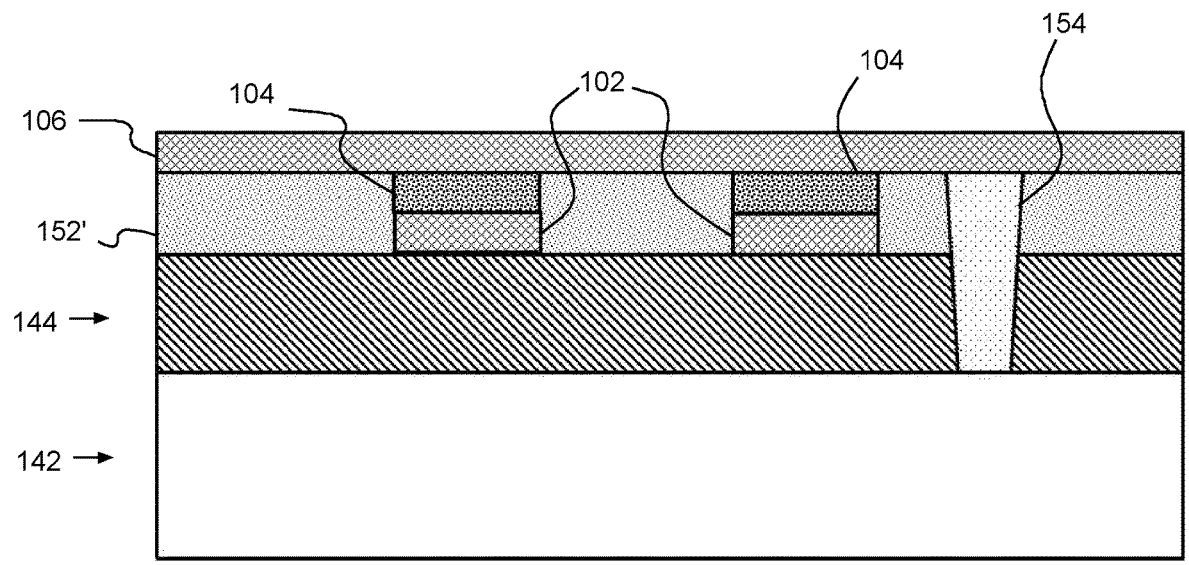

The example of FIGS. 6A-C show a plan and cross-sectional views through B-B and C-C of the completed upper electrode lines 106 defining synapses 102 in ridges 150 (e.g., after removing an optional dielectric hard mask) in an array 100, e.g., on chip 140 of FIGS. 4A-B and 5A-C with like features labeled identically. Interlevel vias 154 are opened through insulating material 152 and underlying dielectric layer 144 to devices/wiring on the FEOL layer or wafer 142. Alternatively, the interlevel vias 154 may be opened only through insulating material 148, each to one or more of the previously formed interlevel vias 146. A metal upper electrode layer may be formed on the wafer. Patterning 128 the upper electrode layer defines upper electrode lines 106.

Alternately, the optional hard mask used to pattern the amorphous germanium layer 148 in FIGS. 5A-C may be a hard metal mask. Further, after defining the synapses 102, the hard mask may remain on the synapses 102, forming upper electrodes 106. Optionally, the amorphous germanium between synapses 102 may be trimmed from ridges 150, e.g., with the hard mask definition, after forming upper electrodes 106. An InterLayer dielectric (ILD) 152' formed on the chip merges with previously formed insulating material 152, filling between the synapses 102 and the upper electrode lines 106. ILD 152' may be formed using typical techniques well known in the art, such as depositing dielectric and planarizing with CMP to the metal upper electrode lines 106. Fabrication continues through the Back End Of the Line (BEOL) 132 to complete the chip or macro 110.

It should be noted that, while the upper electrode lines 106 are shown as refractory metal lines in this example; it is understood that lower electrode metal lines 104 may be refractory metal lines without departing from the spirit and scope of the invention. Further when the lower electrode metal lines 104 are refractory metal, the Schottky barrier diode forms at the bottom of each synapse 102.

Coincidentally selecting a lower electrode line 104 and an upper electrode line 106 independently selects a respective synapse 102. Each Joule heating pulse maintains synapse temperature below 450° C., preferably raising synapse temperature to 150-350° C. during the pulse. The elevated temperature locally diffuses metal, e.g., copper, from the respective electrode lines 104, 106 into the alterable amorphous germanium resistor 102R. Simultaneously, germanium diffuses into copper, i.e., inter-diffusing or inter-mixing copper and germanium. The inter-diffusion reduces synapse 102 resistance, independently programing the selected synapse 102 to a desired, reduced resistance, i.e., an altered state.

For example, germanium has specific heat capacity (c) of about three tenths Joules per gram per degree Celsius (0.3 J/gr/° C.), and a mass density (mass/volume, my) of germanium to a about grams per cubic centimeter (5.5 $gr/cm^3$). The energy (Q) required to raise the temperature ($\Delta\theta$) of a given volume (v) of germanium has the form is determined by $Q=m_v vc\Delta\theta$. Bearing in mind that power (P) dissipated is the square of the voltage across a resistor dived by the resistance ($P=V^2/R$) and energy is power times width ($\Delta t$) of the pulse ($Q=P\times\Delta t$), the pulse width can be determined from $\Delta t=QR/V^2$.

So, to heat the memory element in the example above to increase the temperature 250° C., $Q\approx 5.5$ $gr/cm^3 \times(20$ nm$\times 20$ nm$\times 25$ nm$)\times 0.3$ J/gr/° C.$\times 250$° C.$\approx 4\times 10^{-15}$ joules=4 femtojoules (4 fJ). For this germanium synapse example, applying 1.5V voltage pulses, $\Delta t=QR/V^2=4$ fJ$\times 6$ M$\Omega\times(1.5V)^2\approx$ten nanoseconds (10 ns). Thus, preferably, a voltage pulse of sufficient voltage, e.g., 0.5-2V, preferably 0.7-1.5V, across the selected lines 104, 106 for one to one hundred nanoseconds (1-100 ns) causes sufficient pulse currents. Those pulse currents range from about one kilo-amp per square centimeter to one mega-amp per square centimeter (1 $KA/cm^2$-1 $MA/cm^2$) with resulting Joule heating in the alterable resistor 102R during the Joule heating pulse.

In an alternate embodiment, both the lower and upper electrode lines 104, 106 are copper. Joule heating pulses diffuse copper from both ends into the alterable resistor 102R and produce a significantly larger resistive drop, i.e., a higher signal. In this alternate embodiment instead of forming at each alterable resistor 102R, selector devices (diodes or transistors) are formed in the front end on the FEOL layer 142 and contacted through vias 146 to each respective individual synapse alterable resistor 102R. This alternate embodiment trades density for signal, and has application, for example, to individually placed synapses 102 and small arrays 100 where density is not a concern. Individually placed synapses 102 may be used, for example, as on-chip fuses or selects.

Maintaining synapse temperature below 450° C. avoids/minimizes crystallization, and therefore, is beneficial making resistive programmability accurate over a wide resistance range. While inter-diffusion may introduce some degree of inconsequential crystallization as well as degree of metal-ion transport into the amorphous semiconductor, the resulting resistance reduction from either or both of these is not dominant. Moreover, resistive random access memory (RRAM or ReRAM) arrays, for example, require higher programming "forming" voltages for filament formation. These filaments are a known source of resistance variation. Because preferred synapses not require filament formation, the present invention avoids this unwanted resistance variation.

Figure 7:
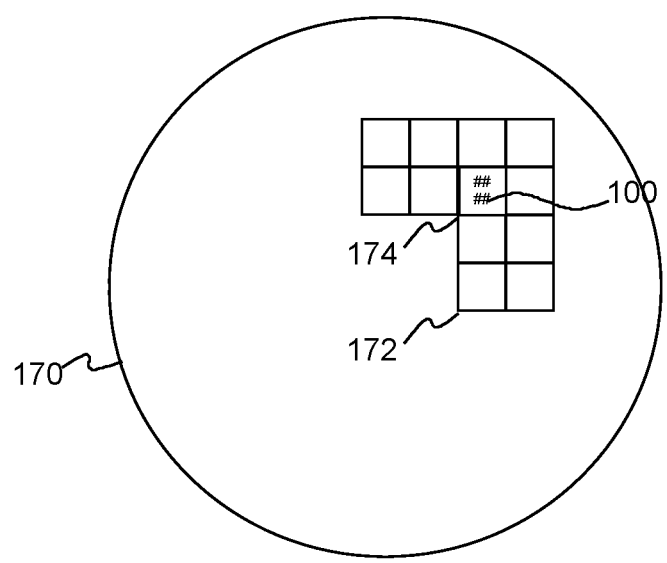
FIG. 7 shows an example of a typical wafer with arrays on multiple IC chips manufactured on the wafer.

FIG. 7 show an example of a typical wafer 170 with multiple IC chips 172 manufactured on the wafer 170. At least one chip 174 includes one or more preferred synaptic crossbar memory arrays 100 formed substantially as described hereinabove.

Advantageously, Joule heating pulses to a preferred synapse keep the anneal time short enough to maintain synapse temperature below 450° C. In contrast, phase-change materials typically require peak temperatures above 600° C., and therefore require high program currents. Because the amorphous germanium remains amorphous, synapses remain at a given temperature for a period shorter than the incubation time for a-Ge crystallization. Thus, preferred synapses avoid poor controllability and other conventional annealing problems, such as explosive crystallization of a-Ge, and also avoid the wide programming range inherent in crystallization.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming an Integrated Circuit (IC) chip, said method comprising:
   forming a plurality of transistors on a surface of a semiconductor wafer;
   forming a connective layer above said plurality of transistors;
   forming a bottom electrode layer on said connective layer, said bottom electrode layer including one or more bottom electrode lines of a first metal and connected to ones said plurality of transistors through said connective layer;
   forming a one or more amorphous semiconductor synapses on said one or more bottom electrode lines;
   forming an upper electrode layer above said one or more amorphous semiconductor synapses, said upper electrode layer including one or more upper electrode lines of a second metal oriented orthogonally to said one or more bottom electrode lines and connected to others of said plurality of transistors, each amorphous semiconductor synapse being between a bottom electrode line and an upper electrode line, said second metal being different than the first and one of said first metal and said second metal being a refractory metal; and
   completing chip fabrication.

2. A method as in claim 1, wherein said amorphous semiconductor comprises an amorphous germanium.

3. A method as in claim 1, wherein said second metal is said refractory metal forming said one or more upper electrode lines, the refractory metal lines forming Schottky barrier diodes at said one or more amorphous semiconductor synapses.

4. A method as in claim 1, wherein said upper electrode lines are copper lines forming resistive contacts on said amorphous semiconductor layer and said refractory metal is tungsten.

5. A method as in claim 1, wherein said refractory metal is selected from tungsten (W), titanium (Ti), titanium nitride (TiN) or a combinations thereof.

6. A method as in claim 5, wherein said refractory metal is tungsten, and wherein at said each amorphous semiconductor synapse one of said first metal and said second metal forms a resistive contact and the other of said first metal and said second metal forms a Schottky barrier junction.

7. A method as in claim 5, wherein said bottom electrode lines are copper lines forming resistive contacts.

8. A method as in claim 1, wherein forming said one or more amorphous semiconductor synapses comprises:
    forming said amorphous semiconductor layer on said bottom electrode layer;
    patterning said amorphous semiconductor layer, patterning said amorphous semiconductor layer defining said one or more amorphous semiconductor ridges, each amorphous semiconductor ridge being coextensive with one of said bottom electrode lines; and
    filling with dielectric material between said one or more amorphous semiconductor synapses, a synapse being defined wherever an upper electrode line crosses a ridge.

9. A method as in claim 8, wherein said amorphous semiconductor layer comprises an amorphous germanium layer, and forming said one or more amorphous semiconductor synapses further comprises forming connective interlevel vias through said dielectric material, said one or more upper electrode lines connecting to said others through respective said connective interlevel vias.

10. An alterable synapse array comprising:
    a plurality of transistors on a device layer;
    a connective layer on said device layer, interlevel vias in said connective layer connecting to selected transistors;
    one or more bottom electrode lines of a first metal on said connective layer, each bottom electrode line connecting to at least one interlevel via;
    one or more amorphous semiconductor synapses, each synapse being on one of said one or more bottom electrode lines; and
    an upper electrode layer above said one or more amorphous semiconductor synapses, said upper electrode layer including one or more upper electrode lines of a second metal oriented orthogonally to said one or more bottom electrode lines and connected to others of said plurality of transistors, each amorphous semiconductor synapse being between a respective bottom electrode line and an upper electrode line, said second metal being different than the first and one of said first metal and said second metal being a refractory metal.

11. An alterable synapse array as in claim 10, wherein said one or more bottom electrode lines are a plurality of copper lines resistively connected to said one or more amorphous semiconductor synapses.

12. An alterable synapse array as in claim 10, wherein the amorphous semiconductor synapses are amorphous germanium synapses.

13. An alterable synapse array as in claim 12, wherein said one or more upper electrode lines are a plurality of refractory metal lines, a Schottky barrier junction being formed at the contact of one of said plurality of refractory metal lines to a respective amorphous germanium synapse; the amorphous germanium in each said synapse has a first selected resistance; and
    applying a selected voltage across a respective bottom electrode line and respective upper electrode line for a selected period of time causes Joule heating to said synapse, said Joule heating switching the amorphous germanium resistance to a second selected resistance.

14. An alterable synapse array as in claim 13, wherein said selected voltage ranges from 0.5-2V, and said selected period is one to one hundred nanoseconds (1-100 ns) long.

15. An alterable synapse array as in claim 13, wherein said refractory metal is selected from a group consisting of tungsten (W), titanium (Ti), titanium nitride (TiN) or a combinations thereof.

16. An alterable synapse array as in claim 13, wherein said refractory metal is tungsten.

17. An alterable synapse array as in claim 10, wherein said upper electrode lines are a plurality of refractory metal lines, a Schottky barrier junction being formed at the contact of one of said plurality of refractory metal lines to a respective amorphous semiconductor synapse, and said one or more bottom electrode lines are a plurality of copper lines resistively connected to said one or more amorphous semiconductor synapses.

18. An Integrated Circuit (IC) chip comprising:
    a plurality of transistors on a device layer;
    a connective layer on said device layer, interlevel vias in said connective layer connecting to selected transistors;
    an alterable synapse array comprising:
        a bottom electrode layer on said connective layer, said bottom electrode layer including one or more bottom electrode lines of a first metal oriented in a first direction, each bottom electrode line connecting to at least one interlevel via,
        one or more amorphous semiconductor ridges, each being on, and coextensive with, one of said one or more bottom electrode lines,
        one or more amorphous semiconductor synapses, each synapse being on one of said one or more bottom electrode lines, and
        an upper electrode layer above said one or more amorphous semiconductor ridges, said upper electrode layer including one or more upper electrode lines of a second metal oriented orthogonally to said one or more bottom electrode lines and connected to others of said plurality of transistors, amorphous semiconductor synapses being formed in said ridges between bottom electrode lines and upper electrode lines; and
    a plurality of wiring layers connecting said plurality of transistors into IC chip circuits.

19. An IC chip as in claim 18, wherein
    said one or more bottom electrode lines comprises a plurality of bottom electrode lines;
    said one or more upper electrode lines comprises a plurality of upper electrode lines;
    said one or more amorphous semiconductor synapses comprises a plurality of amorphous germanium ridges and each having a resistive connection to one electrode and a Schottky barrier junction connected to the other electrode, said each amorphous semiconductor synapse having a first selected resistance; and
    applying a selected voltage across a respective bottom electrode line and upper electrode line for a selected period of time causes Joule heating to the respective synapse, said Joule heating switching the amorphous germanium resistance for selected synapse to a second selected resistance.

20. An IC chip as in claim 19, wherein lines in one of said plurality of bottom electrode lines and said plurality of upper electrode lines are copper resistively connected to said amorphous semiconductor synapses and lines in the other are a refractory metal selected from a group consisting of tungsten (W), titanium (Ti), titanium nitride (TiN) or a combinations thereof.

* * * * *